United States Patent
Chow et al.

(10) Patent No.: US 7,033,866 B2
(45) Date of Patent: Apr. 25, 2006

(54) METHOD FOR MAKING DUAL GAUGE LEADFRAME

(75) Inventors: Wai Wong Chow, Hong Kong (HK); Zhi-Gang Bai, Tian Jin (CN); Clem H. Brown, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/043,224

(22) Filed: Jan. 26, 2005

(65) Prior Publication Data

US 2005/0121756 A1    Jun. 9, 2005

Related U.S. Application Data

(62) Division of application No. 10/644,160, filed on Aug. 20, 2003, now Pat. No. 6,917,097.

(30) Foreign Application Priority Data

Jul. 15, 2003   (CN)   ............... 03146066 A (51) Int. Cl.
*H01L 23/495*   (2006.01)
(52) U.S. Cl. .................. 438/123; 438/124; 257/666; 257/676

(58) Field of Classification Search ................ 438/123, 438/124, 111; 257/666
See application file for complete search history.

(56) References Cited

U.S. PATENT DOCUMENTS 5,557,842 A * 9/1996 Bailey ........................ 29/827

\* cited by examiner

*Primary Examiner*—David Nelms
*Assistant Examiner*—Thinh T Nguyen
(74) *Attorney, Agent, or Firm*—Charles Bergere (57) ABSTRACT

A leadframe (20) for a semiconductor device includes a first leadframe portion (12) having a perimeter that defines a cavity (16) and a plurality of leads (14) extending inwardly from the perimeter and a first thickness. A second leadframe portion (18) is attached to the first leadframe portion (16). The second leadframe portion (18) has a die paddle (20) received within the cavity (16) of the first leadframe portion (12). The second leadframe portion (18) has a second thickness that is greater than a thickness of the first leadframe portion (12). Such a dual gauge leadframe is suitable especially for high power devices in which the die paddle acts as a heat sink.

16 Claims, 5 Drawing Sheets

METHOD FOR MAKING DUAL GAUGE LEADFRAME

This Application is a Divisional of application Ser. No. 10/644,160 Aug. 20, 2003 now U.S. Pat. No. 6,917,097.

BACKGROUND OF THE INVENTION

The present invention relates to integrated circuits and packaged integrated circuits and, more particularly, to a leadframe for packaged integrated circuits.

An integrated circuit (IC) die is a small device formed on a semiconductor wafer, such as a silicon wafer. A leadframe is a metal frame that usually includes a paddle that supports an IC die that has been cut from the wafer. The leadframe has lead fingers that provide external electrical connections. That is, the die is attached to the die paddle and then bonding pads of the die are connected to the lead fingers via wire bonding to provide the external electrical connections. Encapsulating the die and wire bonds with a protective material forms a package. Depending on the package type, the external electrical connections may be used as-is, such as in a Thin Small Outline Package (TSOP), or further processed, such as by attaching spherical solder balls for a Ball Grid Array (BGA). These terminal points allow the die to be electrically connected with other circuits, such as on a printed circuit board.

The lead frame is usually formed of copper or nickel alloy. One way of attaching the die to the die paddle is by soldering. High power devices require extremely high temperature solder die attach (about 300° C.) and device reflow (about 260° C.). However, at high temperatures, the leadframe plating is degraded, which affects the wirebonding process. More particularly, the bondability of gold wire is affected due to the metallurgy change of the plating surface and by solder flux contamination. Further, a thick die paddle is preferred for high power devices to facilitate heat dissipation. However, singulation (saw or punch) of a leadframe formed of very thick metal is difficult and not reliable.

It would be desirable to provide a lead frame that provides good heat dissipation yet is not difficult to singulate. It further would be desirable to be able to attach a die to a die paddle with a high temperature process that does not cause defects.

BRIEF DESCRIPTION OF THE DRAWINGS

The following detailed description of a preferred embodiment of the invention, will be better understood when read in conjunction with the appended drawings. For the purpose of illustrating the invention, there is shown in the drawings an embodiment that is presently preferred. It should be understood, however, that the invention is not limited to the precise arrangement and instrumentalities shown. In the drawings.

DETAILED DESCRIPTION OF PREFERRED EMBODIMENTS

The detailed description set forth below in connection with the appended drawings is intended as a description of the presently preferred embodiment of the invention, and is not intended to represent the only form in which the present invention may be practiced. It is to be understood that the same or equivalent functions may be accomplished by different embodiments that are intended to be encompassed within the spirit and scope of the invention. As will be understood by those of skill in the art, the present invention can be applied to various packages and package types.

Certain features in the drawings have been enlarged for ease of illustration and the drawings and the elements thereof are not necessarily in proper proportion. Further, the invention is shown embodied in a Quad Flat No-lead (QFN) type package. However, those of ordinary skill in the art will readily understand the details of the invention and that the invention is applicable to other package types. In the drawings, like numerals are used to indicate like elements throughout.

The present invention is a leadframe for a semiconductor device. The leadframe includes a first leadframe portion and a second leadframe portion. The first leadframe portion has a perimeter that defines a cavity and a plurality of leads extending inwardly from the perimeter. The second leadframe portion is attached to the first leadframe portion and has a die paddle sized to be received within the cavity of the first leadframe portion. The second leadframe portion has a thickness that is about twice a thickness of the first leadframe portion. Preferably, the first and second leadframe portions are formed of copper and electrically isolated from each other. By providing separate leadframe portions for the die paddle and the lead fingers, the die attach process can be performed before the first and second leadframe portions are put together and thus the lead fingers are not affected by the high temperatures of the die attach and reflow processes. Further, providing the die paddle separate from the lead fingers allows these two portions to have different thicknesses. Thus, the die paddle may be thick to allow for good heat dissipation while the lead fingers are thinner so that singulation is easily performed.

The present invention further provides a semiconductor device having first and second metal leadframe portions, an integrated circuit die, wires and an encapsulant. The first leadframe portion has a plurality of leads that surround a cavity. The second leadframe portion is attached to the first leadframe portion and electrically isolated therefrom. The second leadframe portion has a die paddle received within the cavity of the first leadframe portion. The second leadframe portion has a thickness that is greater than a thickness of the first leadframe portion. The integrated circuit die is attached to the die paddle located within the cavity and surrounded by the plurality of leads. The die includes a plurality of die pads that are electrically connected to corresponding ones of the leads with the wires. The encapsulant covers a top surface of the integrated circuit die, the wires, and a top surface of the leads and at least a bottom surface of the leads and the second leadframe are exposed. The die paddle being relatively thick and having an exposed surface allows it to act as a heat sink for the die. The lead fingers being relatively thin allows for easy singulation.

The present invention further comprises a method of packaging a plurality of semiconductor device simultaneously including the steps of:

providing a first leadframe panel, the first leadframe panel having a plurality of first leadframe portions, each having a perimeter that defines a cavity and a plurality of leads extending inwardly from the perimeter, wherein the first leadframe panel has first, and second sides and a first thickness;

forming a first mating structure along an outer perimeter of the first leadframe panel;

applying an adhesive to a first side of the first leadframe panel;

providing a second leadframe panel, the second leadframe panel including a plurality of second leadframe portions, each including a die paddle having first and second surfaces and a second thickness;

forming a second mating structure along an outer perimeter of the second leadframe panel;

attaching a plurality of semiconductor die to respective ones of the second surfaces of the die paddles, wherein each of the semiconductor die has a plurality of bonding pads on a surface thereof;

stacking the second leadframe panel on the first leadframe panel such that the first surfaces of the die paddles are received within respective ones of the cavities and contact the adhesive, and the first and second mating structures mate with each other;

electrically connecting the plurality of die bonding pads of the die with respective ones of the plurality of leads of respective ones of the second leadframe portions with a plurality of wires;

forming a mold compound over the second surface of the second leadframe panel, the die and the electrical connections; and performing a singulation operation that separates the plurality of first and second leadframe portions from the leadframe panels, thereby forming individual packaged devices.

Figures 1, 2:
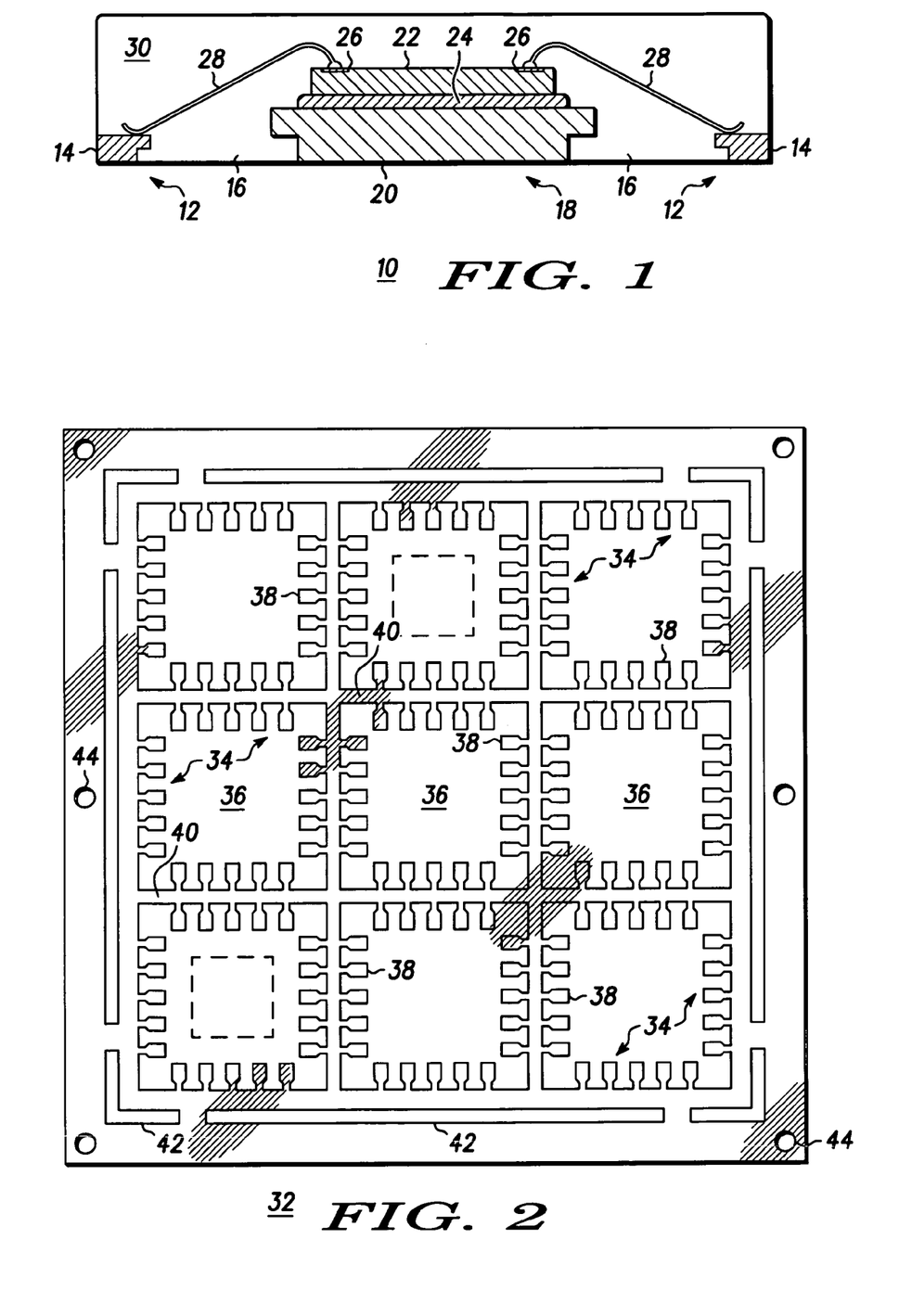
FIG. 1 is an enlarged cross-sectional view of a packaged semiconductor device in accordance with an embodiment of the present invention.
FIG. 2 is a top plan view of a first leadframe panel in accordance with an embodiment of the present invention.

Referring now to FIG. 1, an enlarged cross-sectional view of an embodiment of a semiconductor device 10 in accordance with the present invention is shown. The semiconductor device 10 includes a first leadframe portion 12 that has a plurality of leads 14 that surround a cavity 16. The first leadframe portion 12 is preferably formed of a metal or metal alloy and has a first predetermined thickness. A second leadframe portion 18 is attached to the first leadframe portion 12. The second leadframe portion 18 comprises a die paddle 20 that is received within the cavity 16 of the first leadframe portion. The cavity 16 is sized and shaped in accordance with a size and shape of the IC die being packaged. Thus, although the cavity 16 is generally rectangular or square shaped, it could have other shapes depending on the shape of the integrated circuit die. The second leadframe portion 18 preferably has a second thickness that is different from the first thickness. For example, for power circuits that generate a lot of heat, the second leadframe portion 18 can be used as a heat sink. In such a case, it is preferred that the second thickness is greater than the first thickness. In a more preferred embodiment, the first thickness is about or less than half of the second thickness. In one example, a leadframe was fabricated in which the first portion had a first thickness of about 8 mils and the second thickness was about 20 mils. These sizes allowed the first leadframe portion to be easily singulated and at the same time, the second leadframe portion provided good heat dissipation. The first thickness is also preferably less than about half of the second thickness in order to maintain electrical isolation between the first and second leadframe portions 12 and 18.

The first and second leadframe portions 12 and 18 preferably are formed of a metal or metal alloy, such as copper and may be plated. In one embodiment, the second leadframe portion 18 comprises a 20 mils thick copper slug. The leadframe portions 12 and 18 may be formed by pressing, stamping or etching, as are known by those of skill in the art. The second leadframe portion 18 is attached to the first leadframe portion 12 with an adhesive, such as an adhesive tape, as discussed in more detail below, and although attached, they are preferably electrically isolated from each other. Such electrical isolation is an important feature of the present invention, especially for multi-die assemblies.

An integrated circuit die 22 is attached to the die paddle 20, and as the die paddle is located within the cavity, the die 22 is surrounded by the plurality of leads 14. The integrated circuit die 22 may be of a type known to those of skill in the art, such as a circuit formed on and cut from a silicon wafer. As previously discussed, the cavity 16 is sized and shaped to receive the die 22. Typical die sizes may range from 4 mm×4 mm to 12 mm×12 mm. The die 22 may have a thickness ranging from about 6 mils to about 21 mils. The die 22 is attached to the die paddle 20 in a known manner, such as by a solder die attach process, which allows heat to dissipate from the die 22 to the die paddle 20 by way of the solder 24. In other embodiments, the die 22 may be attached to the die paddle 20 with an adhesive material layer or an adhesive tape.

The die 22 includes a plurality of die bonding pads 26. Ones of the die bonding pads 26 are electrically connected to corresponding ones of the leads 14 by wires 28, preferably with a wirebonding process. Such wires and wirebonding processes are known by those of skill in the art. In one embodiment, 2 mils gold wires are used and in another embodiment, 10 mils aluminum wires are used. However, various known wires of varying materials and diameters may be used, including both coated (insulated) and non-coated wires.

The semiconductor device 10 further includes an encapsulant 30 covering a top surface of the integrated circuit die 22, the wires 28, and the a top surface of the leads 14, leaving at least a bottom surface of the leads 14 and a bottom surface of the second leadframe portion 18 exposed. The exposed portions of the leads 14 are used to connect the device 10 to other devices, such as via a PCB and exposed bottom surface of the die paddle 20 allows heat to dissipate therefrom. The encapsulant 30 comprise may comprise a plastic as is commonly used in packaged electronic devices and is formed over the leadframe portions 12 and 18, the die 22 and wires 28 with a molding process. The total thickness of an exemplary embodiment of the device 10 is about 2 mm.

Referring now to FIG. 2, a top plan view of a first leadframe panel 32 in accordance with the present invention is shown. The first leadframe panel 32 comprises an array of first leadframe portions 34. In this example, the leadframe panel 32 is a 3×3 array. However, in practice, the arrays will be generally larger. Moreover, the array need not have the same number of rows as columns. The first leadframe portions 34 each comprise a perimeter that defines a cavity 36 with a plurality of leads 38 extending inwardly from the perimeter. The cavities 36 are sized and shaped to receive a die paddle, as discussed below. In the embodiment shown, the perimeters of the leadframe portions 34 are defined by tie bars 40 from which the leads 38 extend. Although the leads 38 are shown as being of the same length, the leads 38 may vary in length and width. For example, leads used for power and ground may be wider and shorter than signal leads. The first leadframe panel 32 has a predefined first thickness, such as 8 mils, which is a common dimension for semiconductor leadframes.

Figure 3:
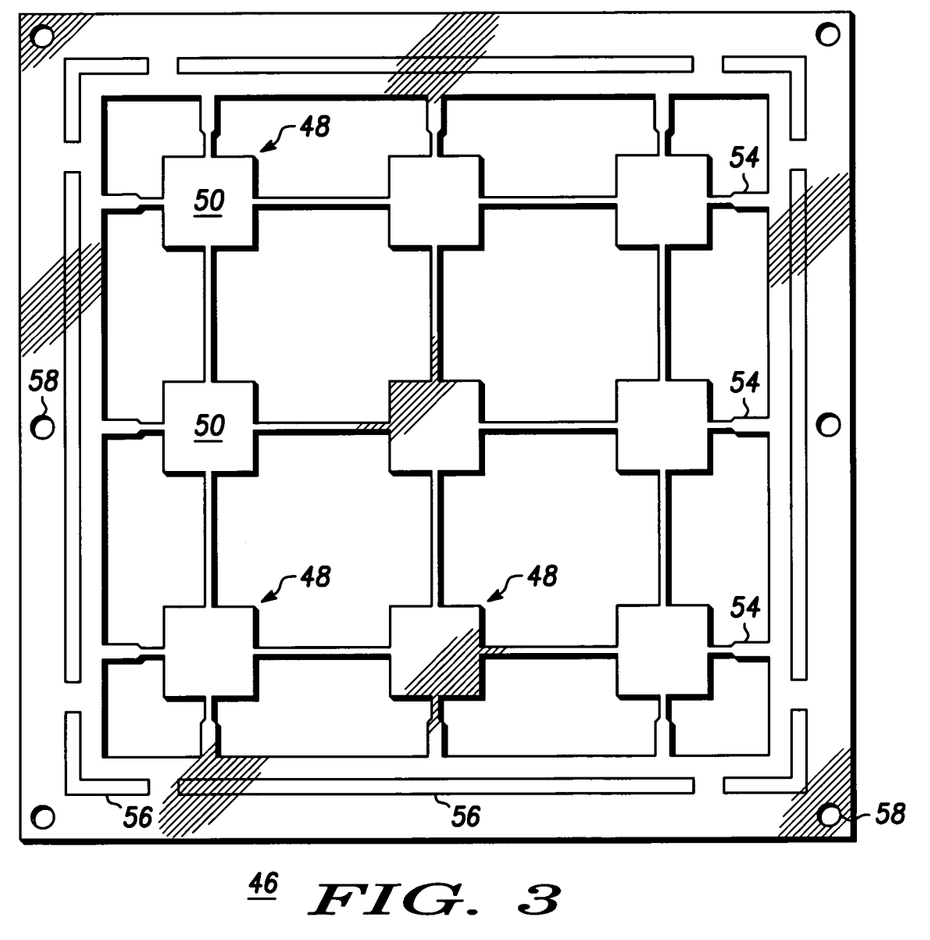
FIG. 3 is a top plan view of a second leadframe panel in accordance with an embodiment of the present invention.

The first leadframe panel 32 also includes a first mating structure 42 formed along an outer perimeter of the first leadframe panel 32. In the presently preferred embodiment, the first mating structure 42 comprises a series of moats that have been etched or cut into the leadframe panel 32. The purpose of the first mating structure 42 will be discussed in more detail below. The first leadframe panel 32 also may include a plurality of marks or holes 44 used to aid in aligning the first leadframe panel 32 with a second leadframe panel (FIG. 3). Such marks or holes 44 may be etched, punched or cut in the panel 32.

Referring now to FIG. 3, a top plan view of a second leadframe panel 46 in accordance with the present invention is shown. The second leadframe panel 46 comprises an array of second leadframe portions 48. As with the first leadframe panel shown in FIG. 2, the second leadframe panel 46 is a 3×3 array, but generally the array is sized to match that of the first leadframe panel 32. The second leadframe portions 48 comprise a die paddle 50. The second leadframe panel 46 is sized and shaped to mate with the first leadframe panel 32 such that the die paddles 50 are received within the cavities 36 and are spaced from the leads 38. However, as discussed with reference to FIG. 1, the die paddles 50 are sized to receive a particular semiconductor die, such as the die 22.

The first and second leadframe panels 32 and 46 are preferably formed from a sheet of conductive metal, metal alloy or plated metal having a good thermal conductivity, such as copper or plated copper. Although it is preferred that the first and second leadframe panels 32 and 46 are formed of the same material, this is not required. The leadframe panels 32 and 46 may be formed by a stamping method, however, for more complex and higher density leadframes, a chemical etching method is preferred. As is understood by those of skill in the art, the etching method uses an artwork mask to define the detailed pattern of the leadframe and then the unmasked portion of the metal is etched away. A plating mask is used to mask out no-plating zones, if any, and then the unmasked portions are plated with metal layers with a plating process. Rinsing and cleaning steps are performed between processes. Such masking, etching, plating, rinsing and cleaning processes are well known to those of skill in the art.

The second leadframe panel 46 also has a predefined second thickness. In the embodiments discussed below, the die paddles 50 are used not only to support a die, but also as a heat sink. Thus, for these embodiments, it is preferred that the second leadframe panel be formed relatively thick. For example, the second predefined thickness should be greater than the first predefined thickness and is preferably two times or more the thickness of the first leadframe panel 32. In one embodiment, the second leadframe panel has a thickness of about 20 mils. The die paddles 50 may be interconnected with tie bars 52. Outer tie bars 54, which are those extending from the outer perimeter of the panel 46 may have a narrow portion following a taper from a wider portion, but this is not required.

The second leadframe panel 46 also preferably includes a second mating structure 56 formed along an outer perimeter thereof that mates with the first mating structure 42 of the first leadframe panel 32. In the presently preferred embodiment, the second mating structure 56 comprises a series of ridges or dams that have been formed in the panel 46 by chemical etching. The second leadframe panel 46 also may include a plurality of marks or holes 58 that can be aligned with the holes 44 in the first leadframe panel 32. Such marks or holes 58 may be etched, punched or cut in the panel 46.

When the first and second leadframe panels 32 and 46 are stacked, that is, when the first leadframe panel 32 is stacked on the second leadframe panel 46, the dams 56 fit within the moats 42 and the die paddles 50 are received within respective ones of the cavities 36. The purpose of the first and second mating structures 42 and 56 is to prevent resin or mold compound bleeding during a molding or encapsulation process, described in more detail below.

Referring now to FIGS. 4A–4F, cross-sectional views of various stages of formation of a semiconductor devices are shown for explaining a process of forming a dual-gauge leadframe semiconductor device in accordance with an embodiment of the invention. FIG. 4 shows a first leadframe panel 60 having a plurality of first leadframe portions 62 (in this example, two are shown). Each of the first leadframe portions 62 has a perimeter that defines a cavity 64 and a plurality of leads 66 extending inwardly from the perimeter. The first leadframe panel 60 has first and second sides 68 and 70 and a predefined first thickness. As previously discussed, the first leadframe panel 70 preferably has a thickness of about 8 mils. The first leadframe panel 60 further includes a first mating structure along an outer perimeter thereof. In the presently preferred embodiment, the first mating structure is a moat 72 formed around the perimeter of the first leadframe panel 60. The moat 70 may be formed by cutting, stamping or etching. The moat 70 in the drawings is shown having tapered sides. However, the sides could be vertical.

Figure 4A:
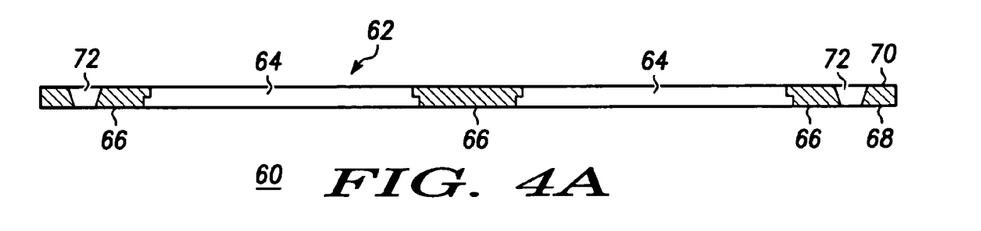
FIGS. 4A–4G are side cross-sectional views illustrating a process of forming a dual-gauge leadframe semiconductor device in accordance with an embodiment of the invention.
Figure 4B:
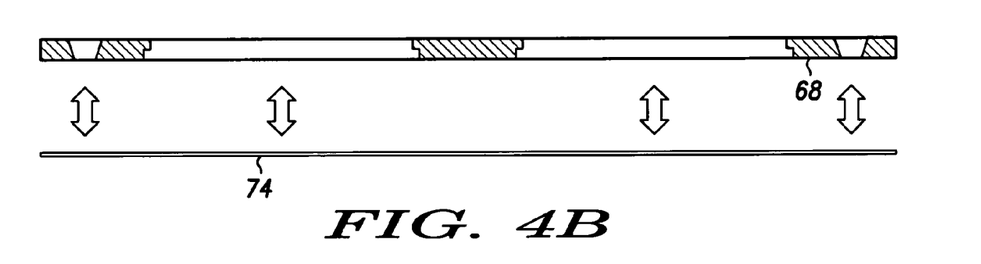

FIG. 4B shows an adhesive 74 being applied to the first side 68 of the first leadframe panel 60. The adhesive 74 preferably comprises an adhesive tape, such as masking tape. The adhesive 74 is used to attach a second leadframe panel to the first leadframe panel 60. At the same time, when the adhesive 74 comprises masking tape, the tape aids in controlling resin bleeding.

Figure 4C:
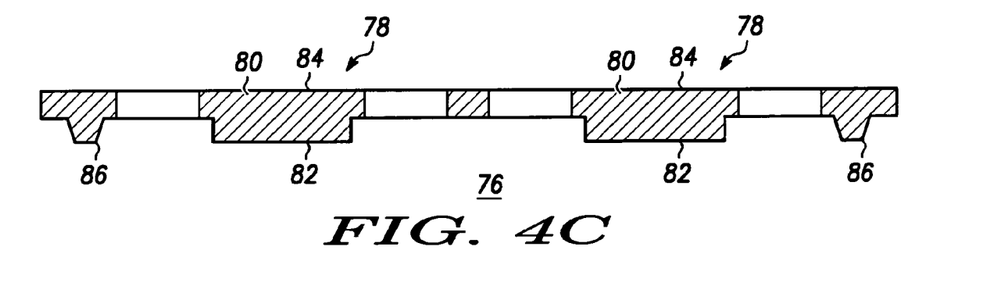

FIG. 4C shows a second leadframe panel 76. The second leadframe panel 76 includes a plurality of second leadframe portions 78 (in this case, two are shown, the same as with the first leadframe panel 60). Each of the second leadframe portions 78 includes a die paddle 80 having first and second surfaces 82 and 84, and a second predefined thickness. The second thickness preferably is greater than the first thickness and in one embodiment the second predefined thickness is about 20 mils. A second mating structure is formed along an outer perimeter of the second leadframe panel 76. The second mating structure is designed to mate with the first mating structure (moat 72). In the presently preferred embodiment, the second mating structure is a dam 86. The dam 86 is sized and shaped to fit within the moat 72 (see FIG. 4F). The dam 86 may be formed by sawing or chemical etching. For example, if the second leadframe panel 76 is formed of a metal having a thickness of about 20 mils, then the edge may be sawn or etched to form the dam 82.

Figure 4D:
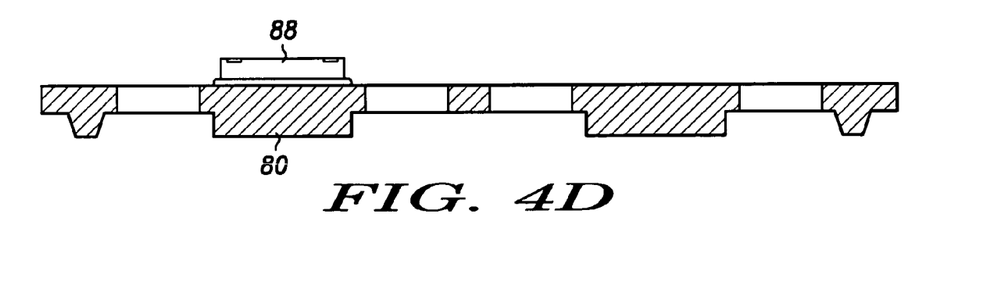

Referring to FIG. 4D, a plurality of semiconductor die 88 are attached to respective ones of the second surfaces of the die paddles 80. FIG. 4D shows one die 88 attached. A next step would be to attach another die to the other die paddle. The die 88 may be attached to the die paddle 80 with an adhesive like epoxy, but preferably is attached with a thermally conductive adhesive, such as solder paste. As will be understood by those of skill in the art, the die 88 includes a plurality of bonding pads on its exposed surface.

Figure 4E:
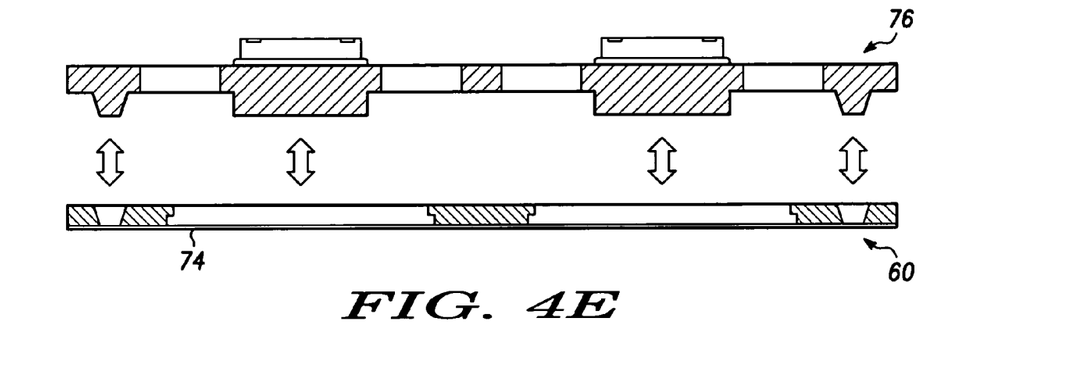

After the dice 88 are attached to the die paddles 80, the first and second leadframe panels 60 and 76 are stacked. That is, the second leadframe panel 76 is stacked on the first leadframe panel 60, as shown in FIG. 4E, such that the first surfaces of the die paddles 80 are received within respective ones of the cavities 64 and contact the adhesive 74, and the first and second mating structures mate with each other. Thus, the dam 86 is received within the moat 72 and contacts the adhesive 74. In the presently preferred embodiment, the first and second leadframe panels 60 and 76, and thus the first and second leadframe portions 62 and 78 are electrically isolated from each other.

Figure 4F:
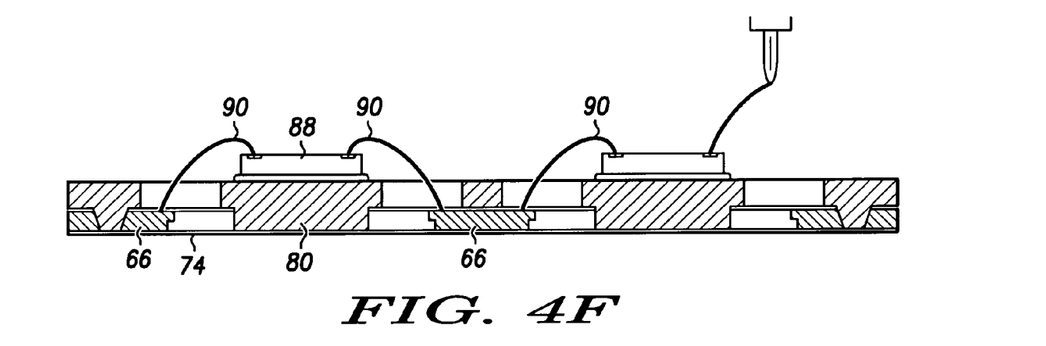
Figure 4G:
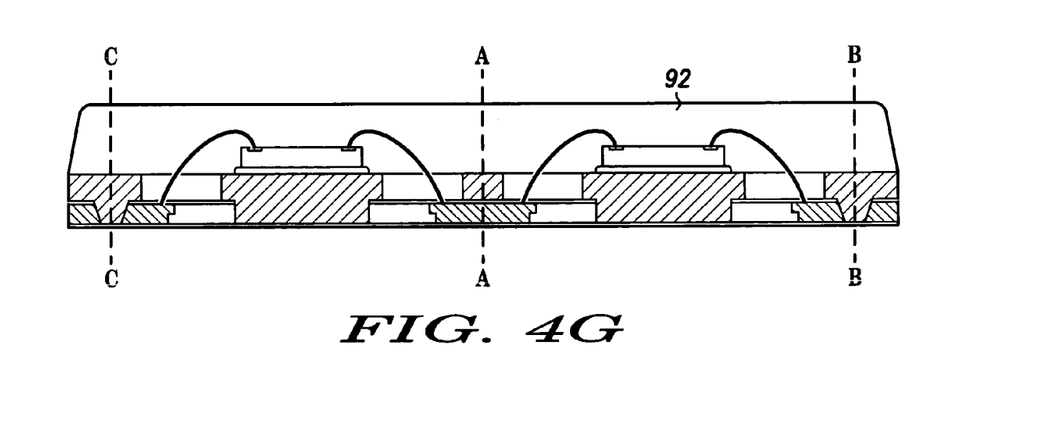

After the leadframe panels 60 and 76 are attached, the die bonding pads of the 88 are electrically connected with respective ones of the plurality of leads 66 of respective ones of the first leadframe portions 62 with a plurality of wires 90. The wires 90 may be connected to the leads 66 and the die pads with a wirebonding process, as shown in FIG. 4F. After wirebonding, a mold compound or encapsulant 92 is formed over the second surface of the second leadframe panel 76, the die 88 and the wires 90, as shown in FIG. 4G. The moat 72 and dam 86 of the first and second mating structures prevent resin bleeding during the molding process.

Individual packaged devices are then formed by performing a singulation operation that separates the plurality of first and second leadframe portions 62 and 78 from the leadframe panels 60 and 76. For example, the panels 60 and 76 may be sawn along dashed lines A—A, B—B and C—C to form the individual devices. The adhesive or masking tape 74 may be removed from the first side 68 of the first leadframe panel 60 and from the first surface 82 of the second leadframe panel 76 either before or after singulation so that the leads 66 and the first surfaces 82 of the second leadframe portions 78 are exposed.

Figure 5:
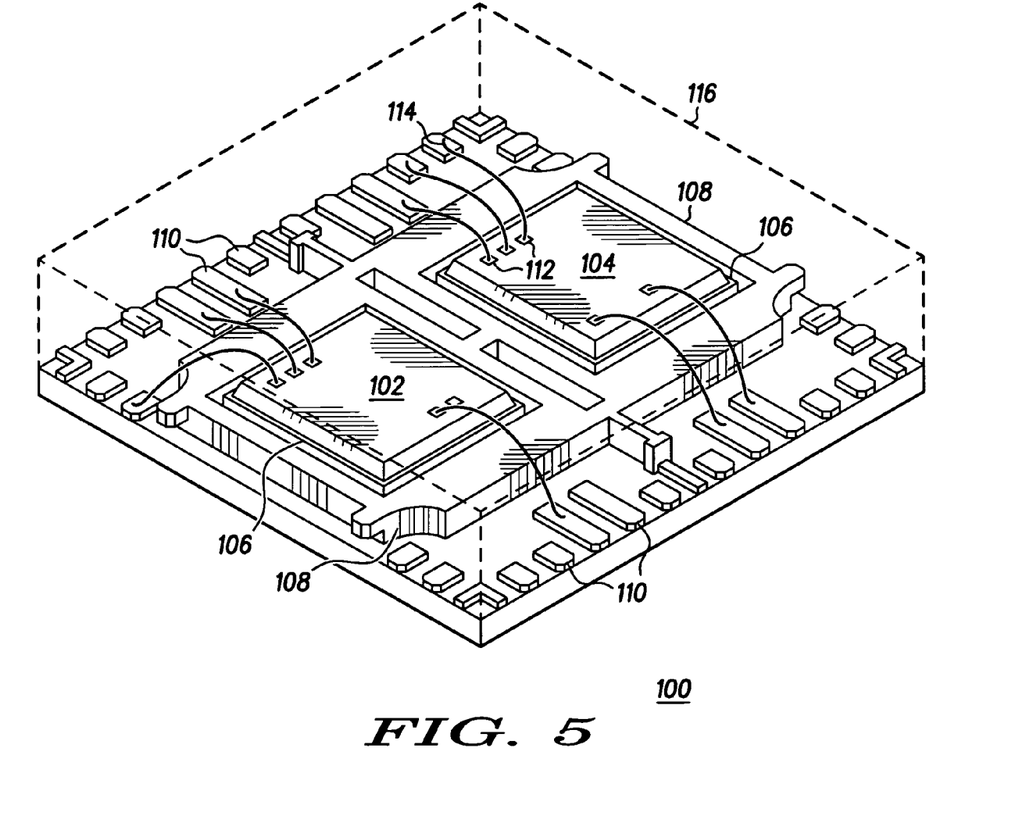
FIG. 5 is an enlarged perspective view of a packaged semiconductor device in accordance with an embodiment of the present invention.

Referring now to FIG. 5, a dual-gauge leadframe packaged device 100 that has two die 102 and 104 in accordance with an embodiment of the present invention is shown. The two die 102 and 104 are attached to relatively thick die paddles 106 of a first leadframe portion 108 while the leads 110 of the device 100 are thinner than the die paddles 106 and the first leadframe portion. The thick die paddles 106 can function as heat spreaders, dissipating the heat generated by the die 102 and 104. Preferably, the die paddles 106 are isolated from the leads 110. As can be seen, the leads 110 may be various lengths (and widths), as desired. The leads 110 are connected to pads 112 on the die 102 and 104 with wires 114. The wires 114 may be connected to the pads 112 and the leads 114 via a conventional wirebonding process. An encapsulant 116 is formed over the die 102 and 104, a top surface of the first leadframe 108, the wires 114 and the leads 110. Bottom surfaces (not shown) of the leads 110 are exposed to allow the device 100 to be connected with other devices or a PCB. The die paddles (heat spreaders) 106 are exposed on a bottom surface too in order to allow for good heat dissipation. The dual-gauge leadframe, multi-die packaged device allows for higher I/O density, yet provides good electrical performance.

The dual gauge lead frame design of the present invention provides a thick paddle and thinner I/O terminals. Providing thinner terminals allows for finer pitch and better dimension control. For sawn type QFN packages, the amount and thickness of copper or metal lead frame material affects the quality of the saw singulation process. Thick copper or metal material is used only where functionally necessary, while thinner metal is used for non-critical areas, such as lead frame fingers, which greatly reduces the amount of metal cutting. Further, in a solder die attach process, having separate paddle and lead fingers prior to wirebonding allows the lead fingers to be kept clean and free of contamination from the solder process, leading to more reliable wire bonding.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, a leadframe having more than two parts could be formed, such as having a die paddle formed of two or more component parts. It is understood, therefore, that this invention is not limited to the particular embodiments disclosed, but covers modifications within the spirit and scope of the present invention as defined by the appended claims.

The invention claimed is:

1. A method of packaging a semiconductor device comprising the steps of:
   providing a first leadframe portion having a perimeter that defines a cavity and a plurality of leads extending inwardly from the perimeter, wherein the first leadframe portion has first and second sides and a first thickness;
   applying an adhesive to a first side of the first leadframe portion;
   providing a second leadframe portion including a die paddle having first and second surfaces and a second thickness that is greater than the first thickness;
   attaching a semiconductor die to the second surface of the die paddle using a high temperature die attach process, wherein the semiconductor die has a plurality of bonding pads on a surface thereof;
   stacking the second leadframe portion on the first leadframe portion such that the first surface of the die paddle is received within the cavity and contacts the adhesive;
   electrically connecting the plurality of die bonding pads with respective ones of the plurality of leads with a plurality of wires, wherein the wires are connected to the leads using a low temperature wire bonding process;
   forming a mold compound over the second side of the second leadframe portion, the semiconductor die, and the electrical connections; and
   removing the adhesive from the first side of the first leadframe portion and from the first surface of the second leadframe portion so that the leads and the first surface of the second leadframe portion are exposed.

2. The method of packaging a semiconductor device of claim 1, wherein the first thickness is about 8 mils and the second thickness is about 20 mils.

3. The method of packaging a semiconductor device of claim 1, wherein the first and second leadframe portions are formed of a metal or metal alloy.

4. The method of packaging a semiconductor device of claim 3, wherein first and second leadframe portions are formed of copper.

5. The method of packaging a semiconductor device of claim 1, wherein the first and second leadframe portions are electrically isolated from each other.

6. The method of packaging a semiconductor device of claim 1, wherein the adhesive applying step comprises applying an adhesive tape to the first side of the first leadframe portion.

7. The method of packaging a semiconductor device of claim 1, wherein the die attaching step comprises attaching the die to the die paddle with a solder paste.

8. The method of packaging a semiconductor device of claim 1, wherein the die attaching step comprises attaching the die to the die paddle with epoxy.

9. A method of packaging a plurality of semiconductor devices, comprising the steps of:

provinding a first leadframe panel, the first leadframe panel having a plurality of first leadframe portions, each having a perimeter that defines a cavity and a plurality of leads extending inwardly from the perimeter, wherein the first leadframe panel has first and second sides and a first thickness;

forming a first mating structure along an outer perimeter of the first leadframe panel;

applying an adhesive to a first side of the first leadframe panel;

providing a second leadframe panel, the second leadframe panel including a plurality of second leadframe portions, each including a die paddle having first and second surfaces and a second thickness that is greater than the first thickness;

forming a second mating structure along an outer perimeter of the second leadframe panel;

attaching a plurality of semiconductor die to respective ones of the second surfaces of the die paddles using a high temperature die attach process, wherein each of the semiconductor die has a plurality of bonding pads on a surface thereof;

stacking the second leadframe panel on the first leadframe panel such that the first surfaces of the die paddles are received within respective ones of the cavities and contact the adhesive, and the first and second mating structures mate with each other;

electrically connecting the plurality of die bonding pads of the die with respective ones of the plurality of leads of respective ones of the first leadframe portions with a plurality of wires, wherein the wires are connected to the leads using a low temperature wire bonding process;

forming a mold compound over the second surface of the second leadframe panel, the die and the electrical connections; and performing a singulation operation that separates the plurality of first and second leadframe portions from the leadframe panels, thereby forming individual packaged devices.

10. The method of packaging a plurality of semiconductor devices of claim 9, further comprising the step of removing the adhesive from the first side of the first leadframe panel and from the first surfaces of the second leadframe portions so that the leads and the first surfaces of the second leadframe portions are exposed.

11. The method of packaging a plurality of semiconductor devices of claim 9, wherein the first thickness is about 8 mils and the second thickness is about 20 mils.

12. The method of packaging a plurality of semiconductor devices of claim 9, wherein the first and second leadframe panels are formed of a metal or metal alloy.

13. The method of packaging a plurality of semiconductor devices of claim 12, wherein first and second leadframe panels are formed of copper.

14. The method of packaging a plurality of semiconductor devices of claim 9, wherein the first and second leadframe portions are electrically isolated from each other.

15. The method of packaging a plurality of semiconductor devices of claim 14, wherein the first mating structure comprises a series of moats and the second mating structure comprises a series of dams, wherein when the first and second leadframe panels are stacked, ones of the series of dams fit within respective ones of the series of moats.

16. The method of packaging a plurality of semiconductor devices of claim 15, wherein the moat and dam structure prevents mold compound bleeding during the mold compound forming step.

* * * * *